US012648492B2

(12) United States Patent
Park et al.

(10) Patent No.: US 12,648,492 B2
(45) Date of Patent: Jun. 2, 2026

(54) MICRO INTEGRATED CIRCUIT WITH INTEGRATED MICRO LIGHT-EMITTING DIODE DISPLAY LAMINATED INTO GLASS

(71) Applicant: GM GLOBAL TECHNOLOGY OPERATIONS LLC, Detroit, MI (US)

(72) Inventors: Jonglee Park, Novi, MI (US); Julien P. Mourou, Bloomfield Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 411 days.

(21) Appl. No.: 18/350,924

(22) Filed: Jul. 12, 2023

(65) Prior Publication Data

US 2025/0022861 A1     Jan. 16, 2025

(51) Int. Cl.
*H10W 90/00*        (2026.01)
(52) U.S. Cl.
CPC .................................. *H10W 90/00* (2026.01)
(58) Field of Classification Search
CPC . B23B 17/10036; B60Q 1/268; H01L 25/167; H01L 25/0753; F21K 9/64; H10F 55/18; H10H 29/8508; H10H 20/012; H10H 29/30
See application file for complete search history.

(56) References Cited

U.S. PATENT DOCUMENTS

| | | | |
|---|---|---|---|
| 8,994,495 B2 | 3/2015 | Dassanayake et al. | |
| 2008/0234895 A1 | 9/2008 | Veerasamy | |

2009/0114928 A1     5/2009   Messere et al.
2015/0085488 A1     3/2015   Grote, III et al.
2015/0176769 A1*    6/2015   Lee ......................... B32B 37/02
                                                               445/24
2021/0107401 A1*    4/2021   Ferrieres-Zhao ... F21V 19/0015
2022/0131026 A1*    4/2022   Koga ..................... B60K 35/60

FOREIGN PATENT DOCUMENTS

DE        102013106648 A1      1/2014

OTHER PUBLICATIONS

German Office Action for Application No. DE 10 2023 127 384.1 dated Feb. 5, 2024, 4 pages.

* cited by examiner

*Primary Examiner* — Alia Sabur
(74) *Attorney, Agent, or Firm* — CANTOR COLBURN LLP

(57)        ABSTRACT

Aspects of the disclosure include the lamination of micro integrated circuits (micro ICs) with integrated micro light-emitting diodes (micro LEDs) into glass or laminated glass assemblies (e.g., a glass panel of a vehicle). An exemplary vehicle includes a laminated glass panel having an outer glass layer, an inner glass layer, and a bonding layer between the outer glass layer and the inner glass layer. The vehicle further includes a display unit embedded in the laminated glass panel. The display unit includes a micro IC having a driving circuit and a micro LED on a surface of the driving circuit. The vehicle includes a controller electrically coupled to the display unit. The controller is configured to direct the driving circuit to deliver a driving voltage to the micro LED.

19 Claims, 8 Drawing Sheets

800

MICRO INTEGRATED CIRCUIT WITH INTEGRATED MICRO LIGHT-EMITTING DIODE DISPLAY LAMINATED INTO GLASS

INTRODUCTION

The subject disclosure relates to display technologies, and particularly to the lamination of micro integrated circuits (micro ICs) with integrated micro light-emitting diodes (micro LEDs) into glass or laminated glass assemblies for smart glass and display applications.

Light-emitting diodes (LEDs) have revolutionized the field of display technology with their efficient and versatile capabilities. LEDs are semiconductor devices that emit light when an electric current is passed through them. LED displays can be monochrome or multi-colored displays, and depending on the underlying architecture, generally leverage an active layer interposed between two doped layers (e.g., an n-type semiconductor layer and a p-type semiconductor layer) and the application of a voltage between the two doped layers to generate light. Voltage causes electrons to be injected into the active layer, which recombine within the active layer to release photons. When compared to traditional incandescent bulbs, LEDs can be driven at relatively low voltages while emitting lower levels of heat, providing comparatively high energy efficiencies. LEDs can be manufactured in a range of display and screen types, such as, for example, in head up displays (HUDs), in-plane displays (e.g., an in-plane communication device laminated in or on a vehicle window to communicate with users inside or outside the vehicle), smart glass applications, and general device displays.

Early generation LED displays were somewhat simple devices configured to display a limited variety of static images, signs, symbols, and/or messages as needed, and are usually fabricated by arranging the LED(s) to feed a lightbar via a collimating optic (i.e., a collimator). Light from the lightbar is mixed using a mixing region or homogenizing region and ultimately displayed in a display region. LED technology has rapidly evolved, however, and displays can now leverage a dense array of micro LEDs to drive sophisticated multipixel displays.

Micro LEDs are tiny individual light-emitting diodes, typically less than 100 micrometers in size, that can be fabricated using advanced semiconductor manufacturing techniques. Micro LED displays offer numerous advantages over prior-generation LED display systems, such as a higher brightness, improved color accuracy, greater energy efficiency, and other enhanced performance characteristics. These attributes make micro LED displays ideal for automotive applications (e.g., in a vehicle's in-plane communication system), where visibility, clarity, and power efficiency are highly desirable.

The conventional way to drive the micro LEDs in a display system is to use a thin film transistor (TFT) backplane installed on an underlying substrate. The TFT backplane acts as a switching element that controls the current flowing through each individual LED pixel in the display. Accordingly, to integrate working micro LEDs into a glass laminate assembly of a vehicle (e.g., a front windshield, a passenger window, etc.), the TFT backplane must be laminated alongside the micro LEDs between the inner and outer glass layers of the glass laminate assembly. In this way, however, more manufacturing processes are required to produce the display, as the laminated window will require more bonding layers and additional lamination steps.

SUMMARY

In one exemplary embodiment a vehicle includes a laminated glass panel having an outer glass layer, an inner glass layer, and a bonding layer between the outer glass layer and the inner glass layer. The vehicle further includes a display unit embedded in the laminated glass panel. The display unit includes a micro IC having a driving circuit and a micro LED on a surface of the driving circuit. The vehicle includes a controller electrically coupled to the display unit. The controller is configured to direct the driving circuit to deliver a driving voltage to the micro LED.

In addition to one or more of the features described herein, in some embodiments, bus lines are directly formed in at least one of the outer glass layer and the inner glass layer. In some embodiments, the display unit(s) are formed on the bus lines.

In some embodiments, the display unit is embedded within the bonding layer of the laminated glass assembly.

In some embodiments, the laminated glass panel includes a color shifting layer between the bonding layer and the inner glass layer. In some embodiments, the color shifting layer is positioned within a patterned protective layer. In some embodiments, the display unit is embedded within the color shifting layer. In some embodiments, the color shifting layer comprises a phosphor material selected to shift a natively emitted color of the micro LED to another color.

In some embodiments, a sensor unit is embedded in the laminated glass panel. The sensor unit can include a micro IC having a driving circuit and a micro sensor on a surface of the driving circuit. In some embodiments, the display unit and the sensor unit are formed on a same surface of the laminated glass panel. In some embodiments, the display unit and the sensor unit are formed on opposite surfaces of the laminated glass panel.

In another exemplary embodiment a laminated glass panel can include an outer glass layer, an inner glass layer, and a bonding layer between the outer glass layer and the inner glass layer. A display unit is embedded in the laminated glass panel. The display unit includes a micro IC having a driving circuit and a micro LED on a surface of the driving circuit.

In yet another exemplary embodiment a method for integrating micro integrated circuits with micro light-emitting diodes in laminated glass assemblies can include forming one or more first glass layers, forming one or more bus lines on the one or more first glass layers, and forming a display unit on the one or more bus lines. The display unit can include a micro IC having a driving circuit and a micro LED on a surface of the driving circuit. The method includes forming a bonding layer over the display unit and the one or more first glass layers, forming one or more second glass layers over the bonding layer, and laminating the one or more first glass layers, the bonding layer, and the one or more second glass layers to define a laminated glass assembly.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
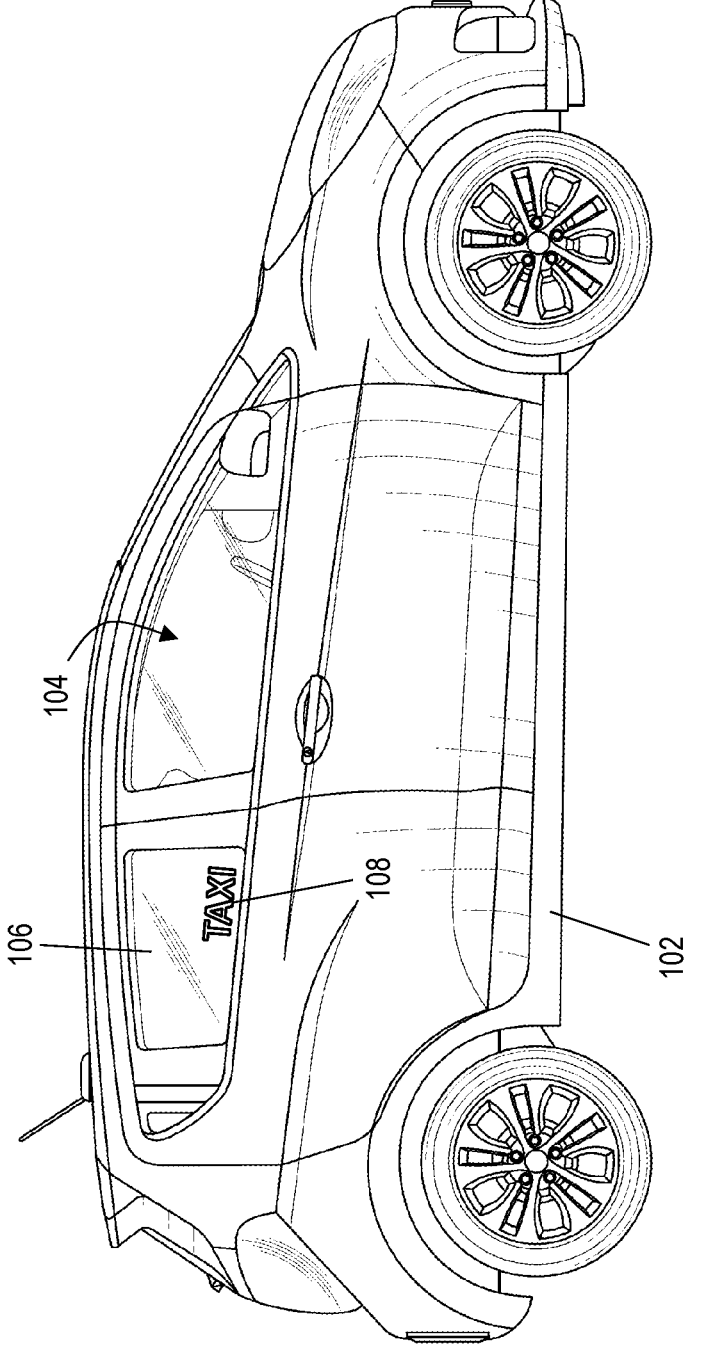
FIG. 1 is a vehicle configured in accordance with one or more embodiments.

The following description is merely exemplary in nature and is not intended to limit the present disclosure, its application or uses. It should be understood that throughout the drawings, corresponding reference numerals indicate like or corresponding parts and features. As used herein, the term module refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

As discussed previously, the conventional way to drive the micro light-emitting diodes (micro LEDs) in a micro LED display system is to use a thin film transistor (TFT) backplane installed on an underlying substrate. While the glass found in many windows is itself a suitable substrate, glass laminate assemblies having more desirable structural characteristics have largely replaced glass panels in modern vehicles. Unfortunately, the presence of the TFT backplane complicates the panel manufacturing process, as TFT backplane integration requires additional bonding layers and/or lamination steps to complete the glass laminate assembly.

This disclosure introduces a way to laminate micro integrated circuits (micro ICs) with integrated micro LEDs into glass or laminated glass assemblies. Rather than relying on a TFT backplane to drive the micro LEDs, displays configured according to one or more embodiments include co-integrated micro ICs installed using complementary metal-oxide semiconductor (CMOS) chiplet technology. The micro ICs described herein can be configured as embedded CMOS driving circuits to drive the micro LEDs without a TFT backplane.

Micro LED displays constructed in accordance with one or more embodiments offer several technical advantages over prior LED-based displays. Notably, integrating the driving circuit (i.e., the micro ICs) with the micro LEDs allows the display system (e.g., the micro LEDs) to be installed on electrical bus lines printed directly on or into a laminated glass assembly (e.g., a vehicle window). In this type of configuration, optical bonding can be achieved using only a single optical bonding layer as the display system is already installed on a layer of the laminated glass assembly. The result is a significant simplification of the panel manufacturing process. Other advantages are possible.

In particular, it is also possible to embed a driving circuit into a micro sensor that can then be installed within a laminated glass assembly using the same techniques described herein for the micro ICs and micro LEDs to enable displays having enhanced in-plane communication features. By-directional communication is also possible, for example, by installing the micro sensors on upper and/or lower glass layers of the laminated glass assembly, depending on the desired sensing area. In some embodiments, one or more driving circuits can be designed to detect the junction temperature of the micro LEDs. In some embodiments, a controller communicatively coupled to the driving circuits can limit the LED driving current of an individual micro LED depending on its temperature. In some embodiments, a phosphor layer can be installed between a patterned protective layer to convert a natively-emitted light color from a micro LED to a color specified by the phosphor (e.g., red phosphor, yellow phosphor, etc.).

A vehicle, in accordance with an exemplary embodiment, is indicated generally at 100 in FIG. 1. Vehicle 100 is shown in the form of an automobile having a body 102. Body 102 includes a passenger compartment 104 within which are arranged a steering wheel, front seats, and rear passenger seats (not separately indicated). Body 102 also includes a number of glass or glass laminate assemblies, such as, for example a laminated glass panel 106. The particular laminated glass panel 106 (here, the rear passenger window) is emphasized only for ease of illustration and discussion. It should be understood that any aspect of the present disclosure can be applied to any of the glass and glass laminate assemblies in the vehicle 100, including, for example, the front windshield, any of the driver and passenger doors (front and rear), the rear glass panel, a sunroof/moonroof, etc. In short, the location, size, arrangement, etc., of the laminated glass panel 106 is not meant to be particularly limited, and all such configurations are within the contemplated scope of this disclosure.

As will be detailed herein, the laminated glass panel 106 includes an embedded display 108. The embedded display 108 includes one or more micro LEDs cointegrated with one or more micro ICs. In some embodiments, the micro LEDs and the micro ICs are embedded with thermal sensors between one or more layers of the laminated glass panel 106 (refer to FIG. 2). In some embodiments, the embedded display 108 includes one or more micro sensors embedded alongside the micro ICs and micro LEDs (refer to FIG. 3). In some embodiments, the one or more micro sensors are embedded on an opposite surface as the micro ICs and micro LEDs (refer to FIG. 4). In some embodiments, the embedded display 108 includes a color shifting layer (e.g., a phosphor layer) within which the micro LEDs are embedded (refer to FIG. 5).

The display 108 is shown having a particular image (here, the text "TAXI") for example and ease of discussion only. It should be understood that the embedded components (micro ICs and micro LEDs) can be arranged, positioned, and/or otherwise configured anywhere within and/or on the laminated glass panel 106 as desired. Those components can be selectively activated using electrical signals (e.g., via driving voltages) to achieve any desired image(s). Moreover, while the image is shown projected in an outward configuration (the image is viewable and oriented for viewing from outside of the vehicle 100), the components can be faced towards the inside of the vehicle 100 as well. In other words, images can be projected into the passenger compartment 104 and/or outside of the vehicle 100 as desired. All such configurations are within the contemplated scope of this disclosure.

Figure 2:
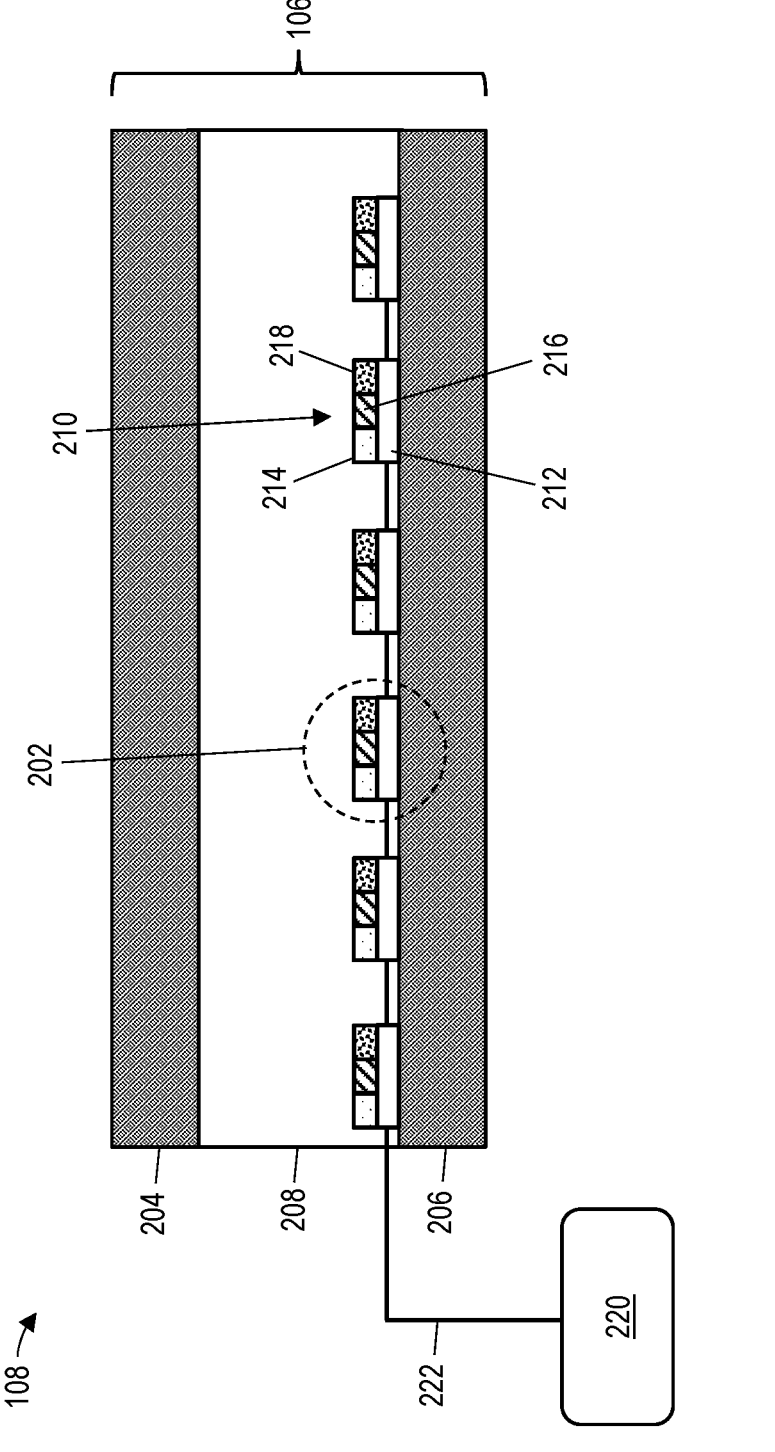
FIG. 2 is a cross-sectional view of a laminated glass panel shown in FIG. 1 in accordance with one or more embodiments.

FIG. 2 illustrates a cross-sectional view of the display 108 shown in FIG. 1 after lamination in accordance with one or more embodiments. As shown in FIG. 2, the laminated glass panel 106 includes one or more display units 202 laminated between an outer glass layer 204 (also referred to as outer glass ply) and an inner glass layer 206 (also referred to as an inner glass ply). In some embodiments, the laminated glass panel 106 includes one or more additional layers above and/or below the outer glass layer 204 and/or the inner glass layer 206. For example, the laminated glass panel 106 can include one or more layers for anti-reflection, solar comfort, auto-tinting, and/or general appearance (not separately shown). In some embodiments, the laminated glass panel 106 includes a bonding layer 208 (also referred to as an optical bonding layer). In some embodiments, the display units 202 are laminated between the outer glass layer 204 and the inner glass layer 206 within the bonding layer 208 (as shown).

The material composition(s) of the outer glass layer 204, the inner glass layer 206, and the bonding layer 208 (collectively, the laminate layers) are not meant to be particularly limited and will vary depend on the needs of the respective application (e.g., desired structural, thermal, and optical properties, etc. of the laminated glass panel 106). In some embodiments, for example, the bonding layer 208 can be made of a plastic interlayer material(s), such as a polyvinyl butyral (PVB) film. In some embodiments, the outer glass layer 204 and the inner glass layer 206 are made of glass, polycarbonate (PC) materials, acrylic materials such as polymethyl methacrylate (PMMA), thermoplastics such as thermoplastic polyurethane (TPU), and/or glass-ceramic materials, such as soda-lime-silica glass-ceramics, aluminosilicate glass-ceramics, lithium aluminosilicate glass-ceramics, spinel glass-ceramics, and beta-quartz glass-ceramics.

The thickness of each of the laminate layers of the laminated glass panel 106 is not meant to be particularly limited and will vary depend on the needs of a respective application (e.g., desired structural, thermal, and optical properties, etc.). In some embodiments, for example, the outer glass layer 204, the inner glass layer 206, and the bonding layer 208 are each formed to a thickness of 1 to 100 microns, or more (e.g., layers can be several inches thick if desired).

The display units 202 can be laminated between the laminate layers of the laminated glass panel 106 during the glass-PVB lamination process. In some embodiments, the display units 202, the outer glass layer 204, the inner glass layer 206, and the bonding layer 208 (e.g., PVB films) are heat-sealed under pressure to laminate the final structure (i.e., the laminated glass panel 106). In some embodiments, the display units 202 can be made of a same or smaller thickness as the bonding layer 208. In some embodiments, the display units 202 are placed in a cutout in the bonding layer 208 prior to the glass/PVB/glass lamination process. In some embodiments, the display units 202 are directly embedded within the bonding layer 208 prior to the glass/PVB/glass lamination process (as shown).

In some embodiments, lamination involves heating (e.g., at temperatures greater than 100 degrees Celsius) and quenching in an autoclave under a pressure of 10 kg-f/cm² or higher, although other lamination conditions (temperatures, pressures, etc.) are within the contemplated scope of this disclosure. In some embodiments, the laminated glass panel 106 can be formed to a total post-lamination thickness of 0.1 mm to 10 mm or greater (e.g., 0.3 mm, 0.7 mm, 2 mm, an inch, several inches, etc.), depending on the application and design targets.

Turning now to the display units 202, in some embodiments, the display units 202 each include a micro LED 210 electrically coupled to a dedicated driving circuit 212 (i.e., a micro IC). In some embodiments, the micro LEDs 210 each include a single LED element. In some embodiments, the micro LEDs 210 each include a plurality of micro LED elements (as shown). For example, in some embodiments, each of the micro LEDs 210 includes a red micro LED element 214, a green micro LED element 216, and a blue micro LED element 218.

The display 108 is shown having a particular number of display units 202 (here, six) and a particular configuration of micro LEDs 210 (here, each micro LED having three elements, each of a different color) for ease of discussion and illustration only. It should be understood, however, that the number, size, configuration, orientation, centerline-to-centerline pitch, etc., of the display units 202 can vary as required for a given display application. Similarly, the number, size, configuration, orientation, centerline-to-centerline pitch, etc., of the elements (e.g., the red micro LED element 214, a green micro LED element 216, and a blue micro LED element 218) of the micro LEDs 210 can vary as required for a given display application. For example, the micro LEDs 210 can include two or more elements of a same color (e.g., blue) and one element of the other color(s) (e.g., red, red and green, yellow, etc.). Moreover, it is not necessary that the micro LEDs 210 each include a same number of elements. For example, some of the micro LEDs 210 can include a first number of elements (e.g., 1, 2, 3, 4, 10, etc.) while some of the micro LEDs 210 can include a second (or third, etc.) number of elements (e.g., 1, 2, 3, 4, 10, etc.). All such configurations are within the contemplated scope of this disclosure.

The micro LEDs 210 can be formed from a range of known suitable material(s), such as, for example, semiconductor materials (e.g., silicon, gallium nitride, indium gallium nitride, etc.) and sapphire, depending on the desired emission color of the respective micro LED. For example, gallium nitride (GaN) for blue LEDs, indium gallium nitride (InGaN) for green LEDs, and aluminum gallium indium phosphide (AlGaInP) for red LEDs. In some embodiments, the micro LEDs 210 include several stacked layers, such as an indium gallium nitride/gallium nitride (InGaN/Gan) stack formed on a silicon or sapphire substrate to produce blue and green devices.

In some embodiments, one or more of the micro LEDs 210 are formed on a surface of a dedicated driving circuit 212. In some embodiments, a driving circuit 212 can include internal electrical connections and components (not separately shown) configured to individually control a respective one of the micro LEDs 210 using electrical signals. For example, a driving circuit 212 can control a respective one of the micro LEDs 210 by selectively passing a driving voltage to the micro LED 210.

In some embodiments, one or more of the driving circuits 212 include internally integrated thermal sensors (not separately shown). In some embodiments, the thermal sensors are configured to measure/monitor an LED junction temperature of the respective micro LED 210. In some embodiments, the driving circuits 212 are configured to gate, limit, and/or otherwise throttle a driving voltage to the micro LED 210 responsive to the LED junction temperature reaching a predetermined thermal limit (e.g., 80 degrees Celsius, 120 degrees Celsius, etc.).

In some embodiments, each driving circuit 212 is communicatively coupled to a controller 220. In some embodiments, the controller 220 is configured to individually direct the driving circuits 212 to selectively activate their respective micro LEDs 210, thereby generating a desired image or graphic (refer to the "TAXI" graphic in FIG. 1). While not meant to be particularly limited, in some embodiments, the controller 220 can include, for example, an Electronic Control Unit (ECU) of the vehicle 100. In some embodiments, the controller 220 and/or the driving circuit 212 can override an activation signal when, for example, an LED junction temperature exceeds a threshold, as discussed previously.

In some embodiments, the display units 202 are installed, formed, or otherwise coupled directly onto bus lines 222 integrated into one or both of the outer glass layer 204 and the inner glass layer 206 (as shown, to a surface of the inner glass layer 206). In some embodiments, the bus lines 222 are electrical/conductive lines and/or imprinted wiring layers directed embedded into one or both of the outer glass layer 204 and the inner glass layer 206. The bus lines 222 are discussed in greater detail with respect to FIGS. 6A, 6B, and 6C.

Figure 3:
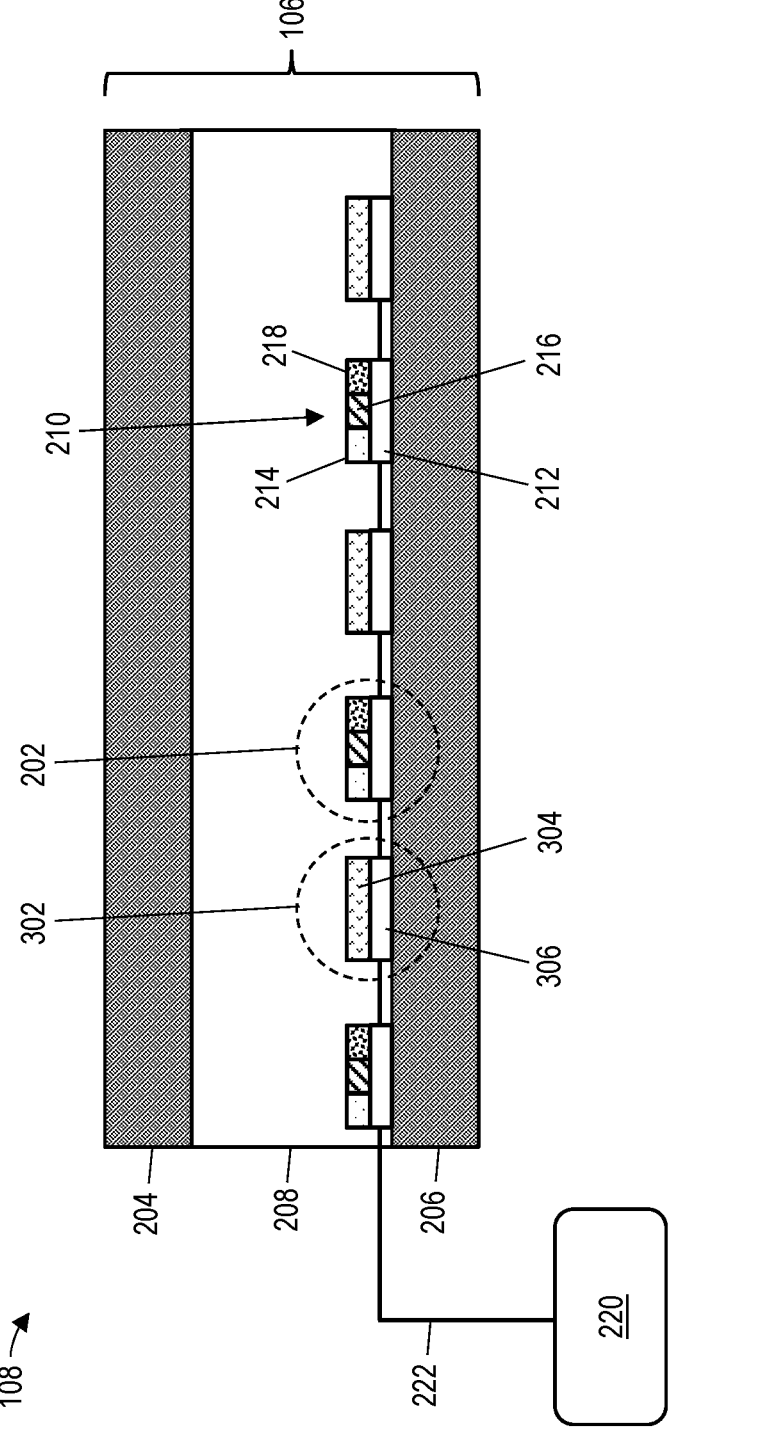
FIG. 3 illustrates an alternative configuration of the laminated glass panel shown in FIG. 2 in accordance with one or more embodiments.

FIG. 3 illustrates an alternative configuration of the laminated glass panel 106 shown in FIG. 2 in accordance with one or more embodiments. The laminated glass panel 106 can be manufactured in a similar manner as discussed with respect to FIG. 2, except that the laminated glass panel 106 shown in FIG. 3 includes one or more sensor units 302 dispersed among the display units 202. FIG. 3 depicts an embodiment where the sensor units 302 and the display units 202 are positioned along a same glass layer (as shown, on a surface of the inner glass layer 206).

In some embodiments, the sensor units 302 each include a micro sensor 304 electrically coupled to a dedicated driving circuit 306 (i.e., a micro IC). In some embodiments, the driving circuit 306 can include internal electrical connections and components (not separately shown) configured to individually control and communicate with a respective one of the micro sensors 304 using electrical signals. For example, a driving circuit 306 can receive in-plane communication data from the micro sensor 304.

In-plane communication refers to the ability of the micro sensors 304 to transmit data or signals through a glass surface (i.e., through the layers of the laminated glass panel 106) without obstructing the view through the glass. By integrating micro sensors 304 within the laminated glass panel 106, the external surfaces of one or both of the outer glass layer 204 and the inner glass layer 206 can act as interactive displays, touch-sensitive interfaces, and/or even transparent communication channels.

In some embodiments, one or more smart glass applications leverage the data collected by the micro sensors 304 to dynamically adjust various properties of the laminated glass panel 106, such as, for example, transparency, tinting, and reflectivity, based on user preferences and/or sensed environmental conditions. Notably, integrating the micro sensors 304 in this manner enables greater privacy controls, energy efficiency, and enhanced user interactions. In particular, by-directional communication is also achievable by installing the micro sensors 304 on a combination of upper or lower glass surfaces, depending on the desired sensing area (refer to FIG. 4).

The micro sensors 304 can include a range of sensing capabilities. While not meant to be an exhaustive list, the micro sensors 304 can include touch sensors, proximity sensors, light sensors, temperature sensors, humidity sensors, motion sensors, and microphones.

Micro touch sensors can be used to enable touch input on glass surfaces. These sensors detect the touch of a finger or a stylus and translate it into corresponding input commands. In some embodiments, the touch sensors are capacitive touch sensors, which measure changes in electrical capacitance when a conductive object, such as a finger, comes into contact with the glass surface.

Proximity sensors detect the presence or absence of an object(s) in close proximity to the glass surface. These sensors emit and receive signals such as infrared light or electromagnetic fields to determine the distance between the sensor and the respective object. Proximity sensors can enable, for example, automatic activation or deactivation of one or more vehicle features based on the presence or absence of a user (driver, passenger, etc.), such as auto-dimming windows or locking, unlocking, opening, and closing automatic doors.

Micro light sensors measure ambient light levels and enable, for example, automatic adjustments to the display brightness or other environmental factors. Light sensors can enable improved visibility and power efficiency by dynamically adapting one or more external systems (cabin lights, HUD brightness, etc.) to the surrounding lighting conditions. Light sensors can enable, for example, automatic headlight control, adaptive displays, and glare reduction.

Micro temperature sensors embedded in glass can provide accurate temperature measurements. These sensors can enable, for example, adaptive climate control systems, thermal monitoring, and temperature-sensitive glass surfaces and can greatly improve driver and passenger comfort.

Micro humidity sensors measure the moisture content in the surrounding environment. These sensors can enable, for example, automatic adjustments to the client control system to maintain desired conditions.

Micro motion sensors detect movement or changes in position. These sensors can enable gesture recognition interfaces for smart and interactive displays. For example, micro motion sensors can enable touchless, hands-free control and gesture-based interactions with a smart display (e.g., the laminated glass panel 106).

Figure 4:
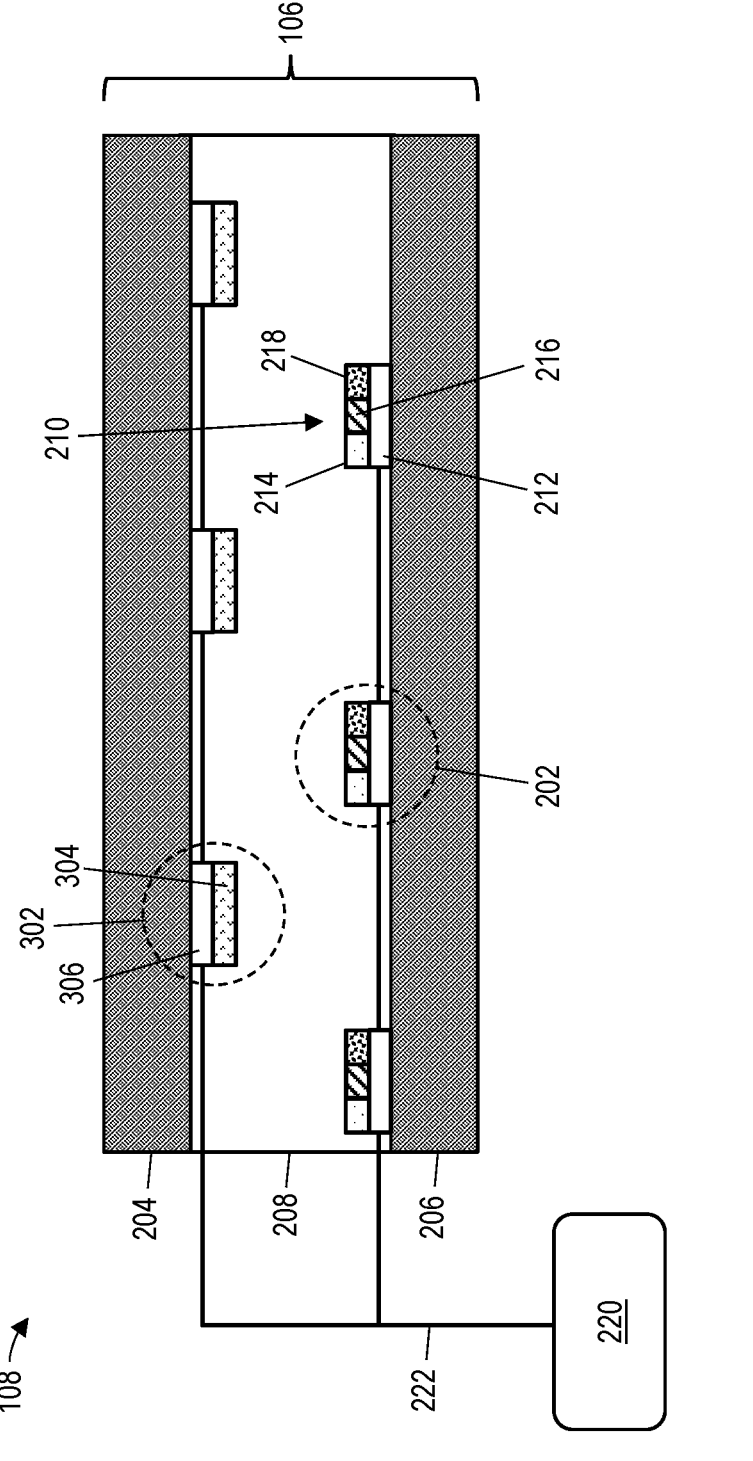
FIG. 4 illustrates yet another alternative configuration of the laminated glass panel shown in FIG. 2 in accordance with one or more embodiments.

FIG. 4 illustrates another alternative configuration of the laminated glass panel 106 shown in FIG. 2 in accordance with one or more embodiments. The laminated glass panel 106 can be manufactured in a similar manner as discussed with respect to FIG. 2, except that the laminated glass panel 106 shown in FIG. 4 includes one or more sensor units 302 dispersed among the display units 202. FIG. 4 depicts an embodiment where the sensor units 302 and the display units 202 are positioned along opposite glass surfaces.

As shown, the display units 202 are on a surface of the inner glass layer 206 and the sensor units 302 are on a surface of the outer glass layer 204. Alternatively, in some embodiments, the sensor units 302 can be formed on a surface of the inner glass layer 206 and the display units 202 can be formed on a surface of the outer glass layer 204 (not separately shown). Alternatively, in some embodiments, the sensor units 302 and the display units 202 can be formed on a combination of the surfaces of the inner glass layer 206 and the outer glass layer 204 (not separately shown). Notably, by-directional communication is achievable by installing the micro sensors 304 on a combination of upper or lower glass surfaces, depending on the desired sensing area.

Figure 5:
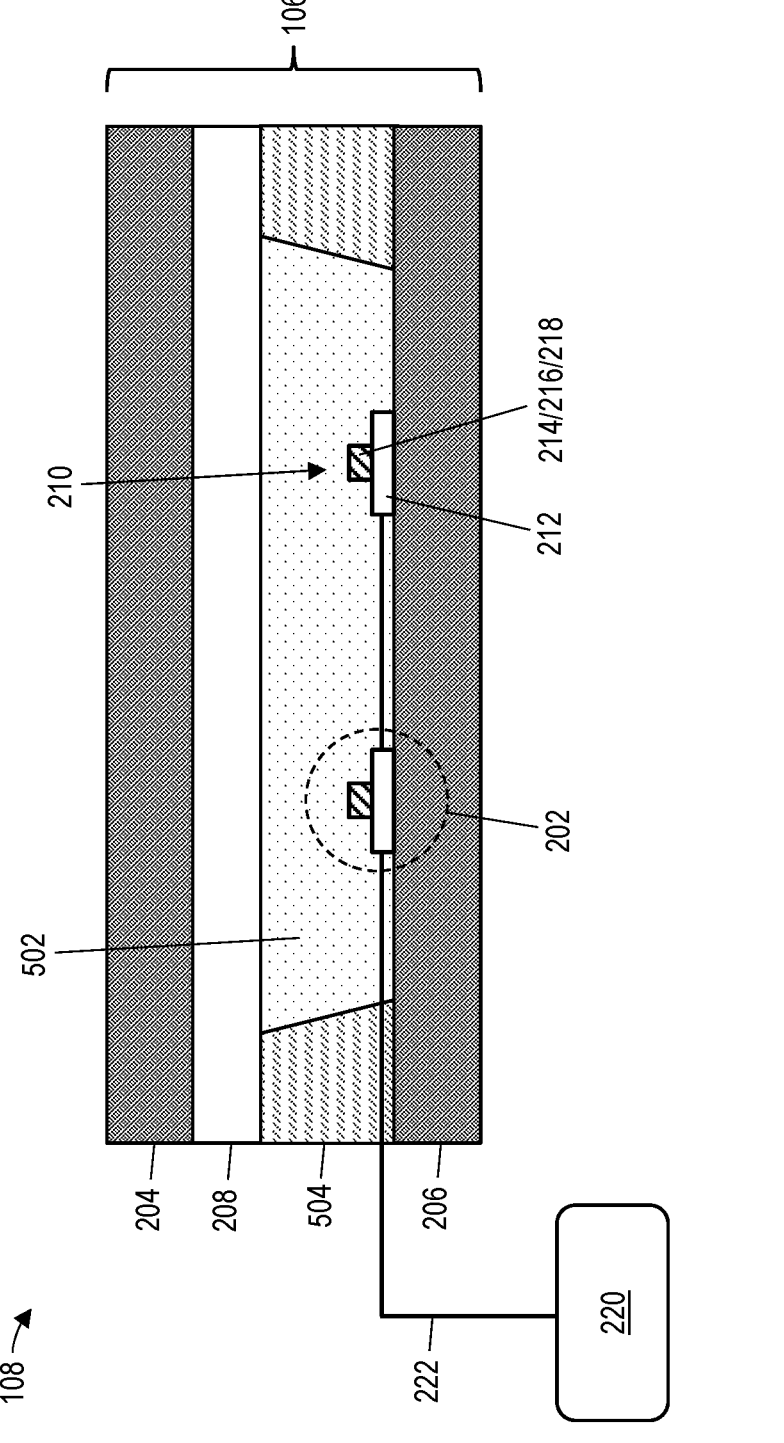
FIG. 5 illustrates yet another alternative configuration of the laminated glass panel shown in FIG. 2 in accordance with one or more embodiments.

FIG. 5 illustrates yet another alternative configuration of the laminated glass panel 106 shown in FIG. 2 in accordance with one or more embodiments. The laminated glass panel 106 can be manufactured in a similar manner as discussed with respect to FIG. 2, except that, in the laminated glass panel 106 shown in FIG. 5, the display units 202 are formed in a color shifting layer 502.

In some embodiments, the color shifting layer 502 is made of a material selected to shift a natively-emitted light color from the micro LEDs 210 to a color(s) specified by the material. For example, in some embodiments, the color shifting layer 502 includes a phosphor (e.g., red phosphor, yellow phosphor, etc.).

Red phosphors can be used to convert blue or ultraviolet (UV) light emitted by the micro LEDs 210 into red light. Red phosphors can include for example, compounds of rare-earth elements such as europium-doped yttrium vanadate ($YVO_4$:Eu), europium-doped yttrium oxide ($Y_2O_3$:Eu), yttrium aluminum garnet (YAG:Eu), yttrium aluminum borate (YAB:Eu), and yttrium orthovanadate ($YVO_4$:Eu).

Green phosphors are used to convert blue or UV light emitted by the micro LEDs 210 into green light. Green phosphors commonly include rare-earth elements such as terbium (Tb) or europium (Eu), combined with other compounds to achieve the desired emission wavelength.

Blue phosphors are used to convert UV light emitted by the micro LEDs 210 into blue light. Blue phosphors can include cerium (Ce)-activated compounds, such as cerium-doped yttrium aluminum garnet (YAG:Ce). Blue phosphors absorb UV light and emit blue light through a process called photoluminescence.

Yellow phosphors are used to convert blue or UV light emitted by the micro LEDs 210 into yellow light. Yellow phosphors can include a combination of rare-earth elements like Ce, Tb, or Y with other compounds.

Orange phosphors are used to convert blue or UV light emitted by the micro LEDs 210 into orange light. Orange phosphors can include Eu and Tb, along with other co-activators (e.g., Ce and Strontium (Sr)).

Cyan phosphors are used to convert blue or UV light emitted by the micro LEDs 210 into cyan light. Cyan phosphors can include Tb and Eu with other compounds (e.g., gadolinium (Gd), aluminum (Al), silicon (Si), oxygen (O), etc.).

White phosphors are used to convert blue or UV light emitted by the micro LEDs 210 into white light. White phosphors can include a blend of red, green, and blue (RGB) phosphors or a combination of blue and yellow phosphors. Alternatively, or in addition, white light can be provided by using a combination of a blue LED with yellow phosphor.

In some embodiments, the color shifting layer 502 is installed, embedded, and/or otherwise formed in a patterned protective layer 504. While not meant to be particularly limited, the patterned protective layer 504 can include optically transparent and/or opaque bonding materials, such as PC, PMMA, transparent polyethylene terephthalate (PET) films, and transparent conductive oxides (TCOs), depending on the application. In some embodiments, the patterned protective layer 504 can also include optically reflective material(s) to improve lighting efficiency. Such materials can include, for example, epoxy, silicon, and/or other optically reflective materials.

Figures 6A, 6B, 6C:
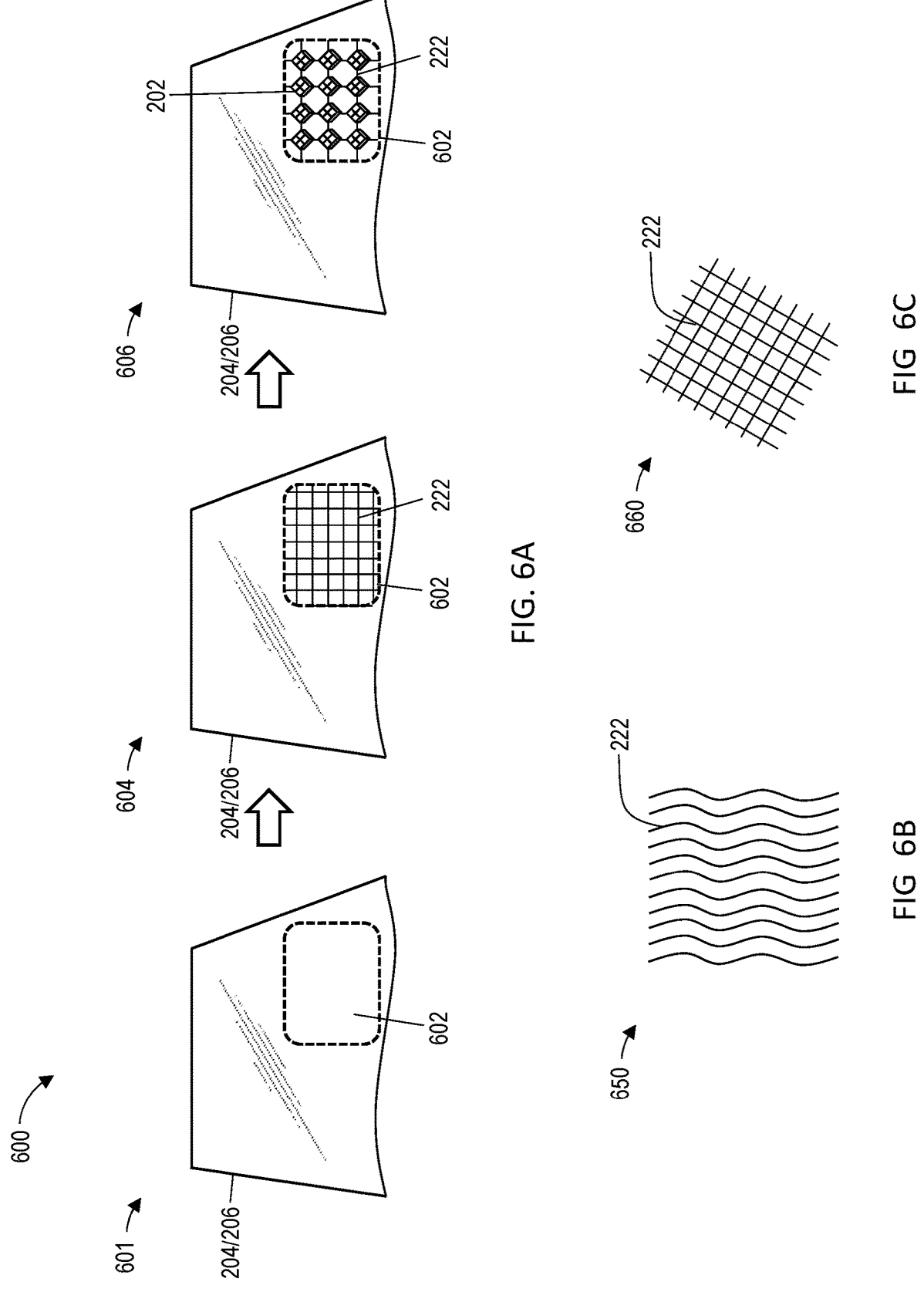
FIG. 6A illustrates a process for forming a laminated glass panel in accordance with one or more embodiments.
FIG. 6B illustrates an alternative layout for the bus lines in FIG. 6A in accordance with one or more embodiments.
FIG. 6C illustrates another alternative layout for the bus lines in FIG. 6A in accordance with one or more embodiments.

FIG. 6A illustrates a process 600 for forming a laminated glass panel 106 in accordance with one or more embodiments. The process 600 begins at step 601, where a first glass layer (e.g., one of the outer glass layer 204 and the inner glass layer 206) of the laminated glass panel 106 is formed and/or received from upstream processes. In some embodiments, a surface of a display region(s) 602 of the glass is prepped for a bus line module. In some embodiments, prepping the glass surface can include cleaning and polishing the surface, marking a wiring path, sanding, and/or heating.

At step 604, one or more bus lines 222 are built directly into the first glass layer. In some embodiments, the bus lines 222 are electrical/conductive lines and/or imprinted wiring layers. In some embodiments, a combination of masking and etching techniques can be used to install the conductive traces and/or wires which make up the bus lines 222. Masking generally involves applying a protective material onto areas of the first glass layer where the bus lines will not be formed, while etching involves selectively removing material (glass or conductive traces/wires) post-deposition to define the areas where the bus lines 222 will be embedded. In some embodiments, forming the bus lines 222 includes depositing or forming a conductive material onto the prepared glass surface within the patterned areas of a mask. The deposition process can include, for example, three-dimensional (3D) printing, screen printing, sputtering, electroplating, etc. In some embodiments, the conductive material can be a metal, such as silver, gold, or copper, a conductive polymer, or a combination thereof, depending on the desired electrical properties, although any conductive material is within the contemplated scope of this disclosure. In some embodiments, the first glass layer is subjected to a curing and/or firing process after building the bus lines 222 to solidify and/or complete the bonding process.

At step 606, one or more display units 202 are installed onto the bus lines 222 and the first glass layer. As discussed previously, the display units 202 can include micro IC integrated micro LEDs having a micro LED 210 electrically coupled to a dedicated driving circuit 212 (refer to FIGS. 2-5). In some embodiments, one or more sensor units 302 are installed onto the bus lines 222 and the first glass layer. As discussed previously, the sensor units 302 can include micro IC integrated micro sensors having a micro sensor 304 electrically coupled to a dedicated driving circuit 306 (refer to FIGS. 3 and 4).

After step 606, the laminated glass panel 106 can be completed as described previously. For example, the other glass layer (e.g., the other one of the outer glass layer 204 and the inner glass layer 206) and a bonding layer 208 can be laminated together with the first glass layer to define the laminated glass panel 106.

The bus lines 222 are shown having a particular arrangement (here, as a matrix of rows and columns) for example and ease of discussion only. It should be understood that the bus lines 222 can be arranged, positioned, and/or otherwise configured anywhere within and/or on the laminated glass panel 106 as desired. All such configurations are within the contemplated scope of this disclosure. For example, FIG. 6B illustrates an alternative layout 650 for the bus lines 222 in accordance with one or more embodiments. As shown, the bus lines 222 can be arranged as a plurality of curved lines. FIG. 6C illustrates another alternative layout 660 for the bus lines 222 in accordance with one or more embodiments. As shown, the bus lines 222 can be arranged in a crosshatch pattern. While the bus lines 222 are shown distributed in a single layer for ease of illustration and discussion, in some embodiments, one or more of the bus lines 222 can be formed in layers above and/or below the bus lines 222. That is, bus lines 222 can be formed across multiple bus line layers. Forming the bus lines 222 in multiple layers can protect against electrical interference.

Figure 7:
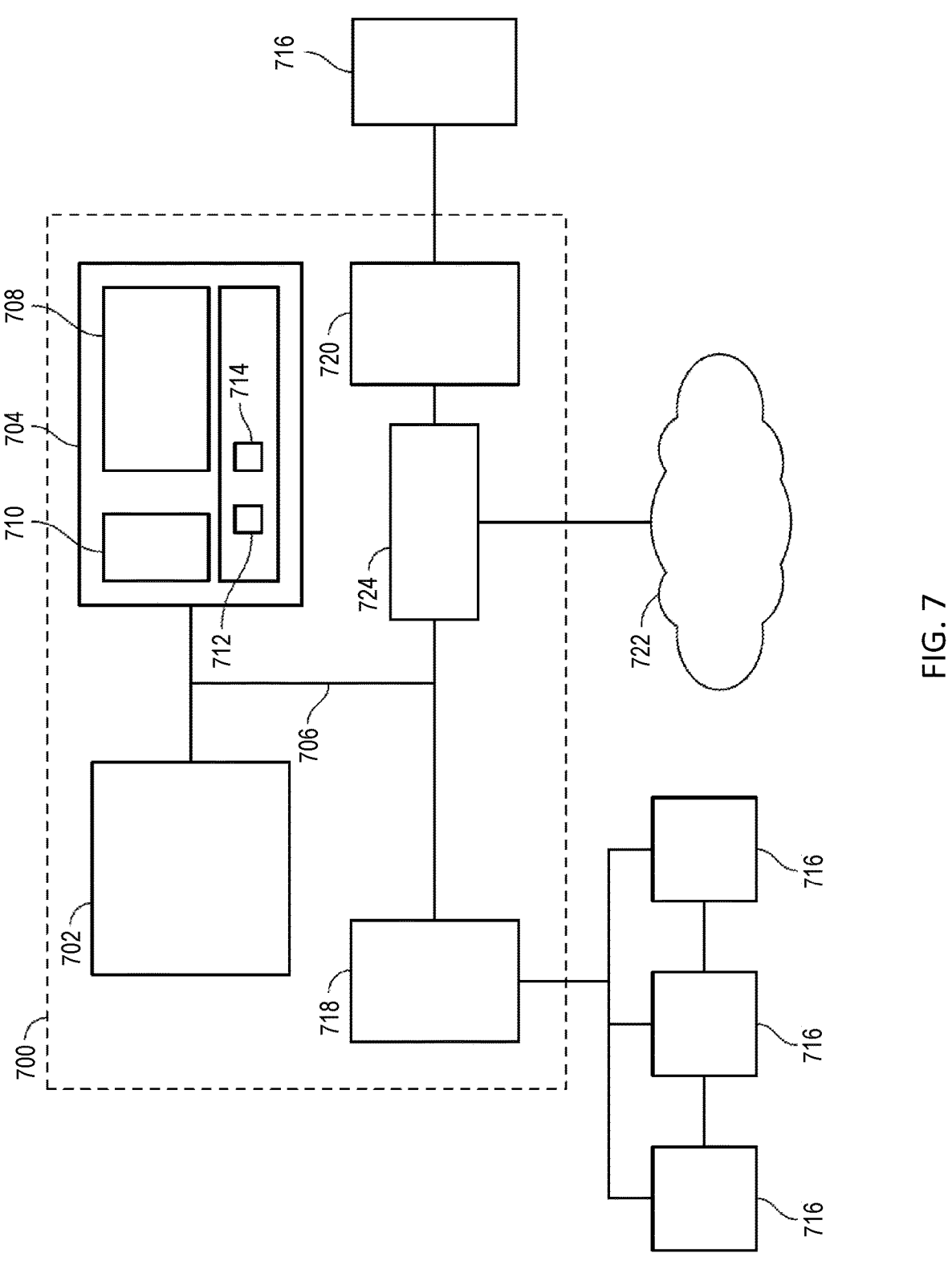
FIG. 7 is a computer system according to one or more embodiments.

FIG. 7 illustrates aspects of an embodiment of a computer system 700 that can perform various aspects of embodiments described herein. In some embodiments, the computer system 700 can be incorporated within or in combination with a micro LED display (e.g., the display 108), a driving circuit (e.g., driving circuit 212, driving circuit 306), and/or a controller (e.g., controller 220). The computer system 700 includes at least one processing device 702, which generally includes one or more processors for performing a variety of functions, such as, for example, controlling driving voltages to one or more of the micro LEDs 210 of the display 108. More specifically, the computer system 700 can include the logic necessary to direct the driving circuit 212 to activate or deactivate the individual micro LEDs 210 or any subset of the micro LEDs 210 of the display 108. In addition, the computer system 700 can include the logic necessary to carry out the sensing functions of the sensor units 302.

Components of the computer system 700 include the processing device 702 (such as one or more processors or processing units), a system memory 704, and a bus 706 that couples various system components including the system memory 704 to the processing device 702. The system memory 704 may include a variety of computer system readable media. Such media can be any available media that is accessible by the processing device 702, and includes both volatile and non-volatile media, and removable and non-removable media.

For example, the system memory 704 includes a non-volatile memory 708 such as a hard drive, and may also include a volatile memory 710, such as random access memory (RAM) and/or cache memory. The computer system 700 can further include other removable/non-removable, volatile/non-volatile computer system storage media.

The system memory 704 can include at least one program product having a set (e.g., at least one) of program modules that are configured to carry out functions of the embodiments described herein. For example, the system memory 704 stores various program modules that generally carry out the functions and/or methodologies of embodiments described herein. A module or modules 712, 714 may be included to perform functions related to control of the display 108, such as, for example, determining a target image based on in-vehicle, environmental, pre-programmed, or external data and directing the display 108 (via, e.g., the driving circuits 212) to drive one or more of the micro LEDs 210 to create the target image. The computer system 700 is not so limited, as other modules may be included depending on the desired functionality of the respective displays. As used herein, the term "module" refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality. For example, the module(s) can be configured via software, hardware, and/or firmware to cause a display (the display 108) to display an image, such as, for example, a vehicle status or a driver and/or passenger communication.

The processing device 702 can also be configured to communicate with one or more external devices 716 such as, for example, a keyboard, a pointing device, and/or any devices (e.g., a network card, a modem, vehicle ECUs, etc.) that enable the processing device 702 to communicate with one or more other computing devices. Communication with various devices can occur via Input/Output (I/O) interfaces 718 and 720.

The processing device 702 may also communicate with one or more networks 722 such as a local area network (LAN), a general wide area network (WAN), a bus network and/or a public network (e.g., the Internet) via a network adapter 724. In some embodiments, the network adapter 724 is or includes an optical network adaptor for communication over an optical network. It should be understood that although not shown, other hardware and/or software components may be used in conjunction with the computer system 700. Examples include, but are not limited to, microcode, device drivers, redundant processing units, external disk drive arrays, RAID systems, and data archival storage systems, etc. In some embodiments, the computer system 700 and/or the processing device 702 can receive information from one or more micro sensors (e.g., the sensor units 302), analyze said information, and send the information (raw, pre-processed, and/or post-processed) to one or more LEDs (e.g., the micro LEDs 210) and/or any other component of the vehicle 100.

Figure 8:
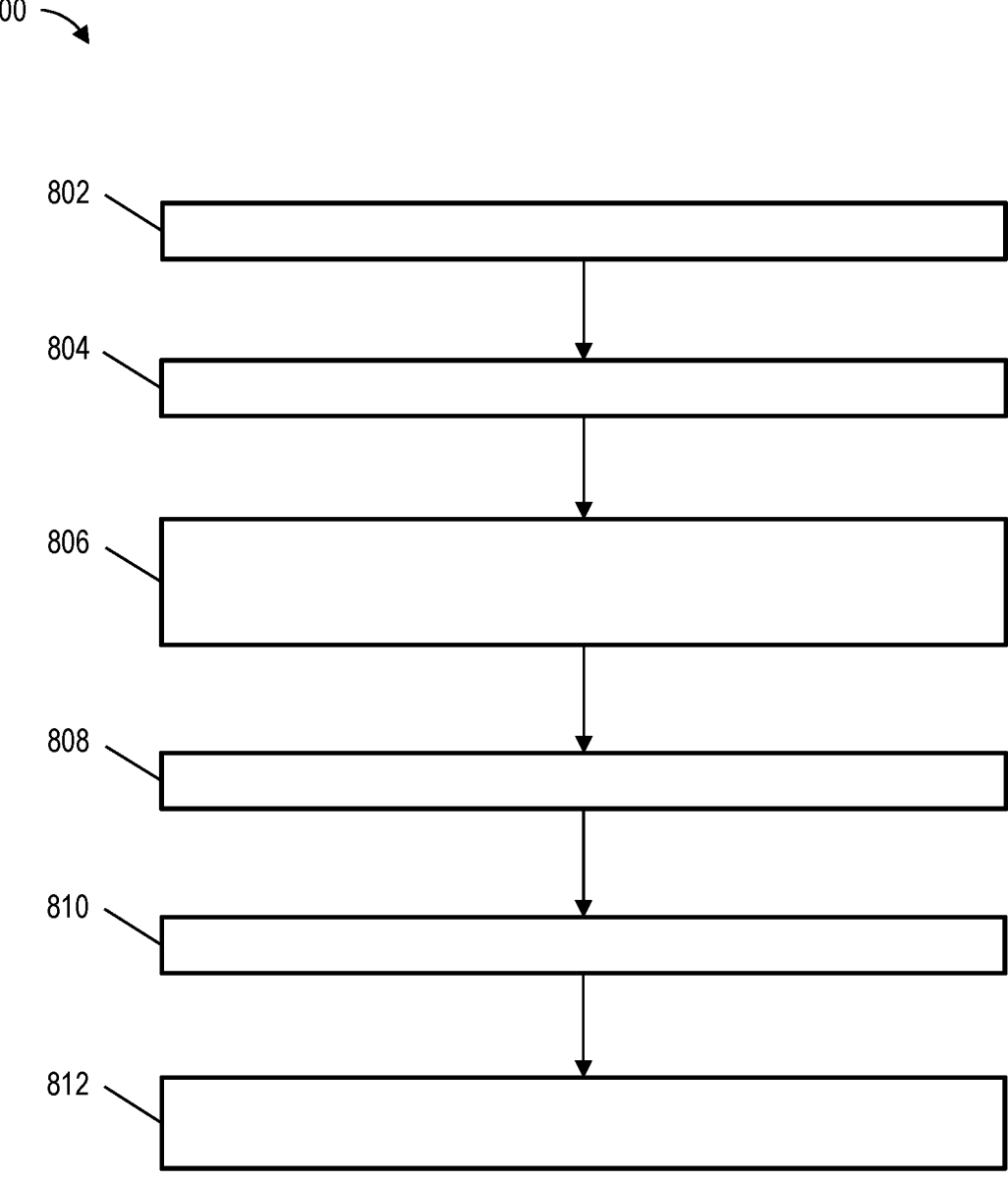
FIG. 8 is a flowchart in accordance with one or more embodiments.

Referring now to FIG. 8, a flowchart 800 for integrating micro integrated circuits with micro light-emitting diodes in laminated glass assemblies is generally shown according to an embodiment. The flowchart 800 is described in reference to FIGS. 1 to 7 and may include additional steps not depicted in FIG. 8. Although depicted in a particular order, the blocks depicted in FIG. 8 can be rearranged, subdivided, and/or combined.

At block 802, the method includes forming one or more first glass layers.

At block 804, the method includes forming one or more bus lines on the one or more first glass layers.

At block 806, the method includes forming a display unit on the one or more bus lines. The display unit includes a micro IC having a driving circuit and a micro LED on a surface of the driving circuit. In some embodiments, a plurality of micro LEDs are formed on the surface of the driving circuit.

At block 808, the method includes forming a bonding layer over the display unit and the one or more first glass layers. In some embodiments, the display unit is embedded within the bonding layer of the laminated glass assembly.

At block 810, the method includes forming one or more second glass layers over the bonding layer. In some embodiments, the method further includes forming a sensor unit embedded in the laminated glass panel. In some embodiments, the one or more first glass layers include one or more embedded micro sensor units. In some embodiments, the one or more second glass layers include one or more embedded micro sensor units. The sensor units can include a micro IC having a driving circuit and a micro sensor(s) on a surface of the driving circuit. Embedding micro sensors in the second glass layer(s) can enable bi-directional communication.

At block 812, the method includes laminating the one or more first glass layers, the bonding layer, and the one or more second glass layers to define a laminated glass assembly.

In some embodiments, the method further includes forming a color shifting layer between the bonding layer and one of the first glass layer and the second glass layer. In some embodiments, the color shifting layer is positioned within a patterned protective layer. In some embodiments, the display unit is embedded within the color shifting layer.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A vehicle comprising:
a laminated glass panel comprising an outer glass layer, an inner glass layer, and a bonding layer between the outer glass layer and the inner glass layer;
a display unit embedded in a first surface of the laminated glass panel, the display unit comprising a plurality of pixels, each pixel comprising:
a micro integrated circuit (IC) comprising a driving circuit; and
a micro light-emitting diode (LED) on a surface of the driving circuit;
a plurality of sensor units embedded in a second surface of the laminated glass panel opposite and facing the first surface, the plurality of sensor units alternating with the plurality of pixels; and
a controller electrically coupled to the display unit, the controller configured to direct the driving circuit to deliver a driving voltage to the micro LED;
wherein the first surface is free of sensor units and the second surface is free of pixels.

2. The vehicle of claim 1, further comprising bus lines directly formed in at least one of the outer glass layer and the inner glass layer, wherein the display unit is formed on the bus lines.

3. The vehicle of claim 1, wherein the display unit is embedded within the bonding layer of the laminated glass panel.

4. The vehicle of claim 1, further comprising a color shifting layer between the bonding layer and the inner glass layer.

5. The vehicle of claim 4, wherein the color shifting layer is positioned within a patterned protective layer.

6. The vehicle of claim 4, wherein the display unit is embedded within the color shifting layer.

7. The vehicle of claim 4, wherein the color shifting layer comprises a phosphor material selected to shift a natively emitted color of the micro LED to another color.

8. The vehicle of claim 1, wherein the sensor unit comprises:
a micro IC comprising a driving circuit; and
a micro sensor on a surface of the driving circuit.

9. The vehicle of claim 8, wherein the display unit and the sensor unit are formed on opposite surfaces of the laminated glass panel.

10. A laminated glass panel comprising:
an outer glass layer;
an inner glass layer;
a bonding layer between the outer glass layer and the inner glass layer;
a display unit embedded in a first surface of the laminated glass panel, the display unit comprising a plurality of pixels, each pixel comprising:
a micro integrated circuit (IC) comprising a driving circuit; and
a micro light-emitting diode (LED) on a surface of the driving circuit; and
a plurality of sensor units embedded in a second surface of the laminated glass panel opposite and facing the first surface, the plurality of sensor units alternating with the plurality of pixels;
wherein the first surface is free of sensor units and the second surface is free of pixels.

11. The laminated glass panel of claim 10, further comprising a controller electrically coupled to the display unit, the controller configured to direct the driving circuit to deliver a driving voltage to the micro LED.

12. The laminated glass panel of claim 10, further comprising bus lines directly formed in at least one of the outer glass layer and the inner glass layer, wherein the display unit is formed on the bus lines.

13. The laminated glass panel of claim 10, wherein the display unit is embedded within the bonding layer of the laminated glass panel.

14. A method for integrating micro integrated circuits with micro light-emitting diodes in laminated glass assemblies, the method comprising:
forming one or more first glass layers;
forming one or more first bus lines on the one or more first glass layers;
forming a display unit on the one or more first bus lines, the display unit comprising a plurality of pixels, each pixel comprising:
a micro integrated circuit (IC) comprising a driving circuit; and
a micro light-emitting diode (LED) on a surface of the driving circuit;
forming a bonding layer over the display unit and the one or more first glass layers;
forming one or more second glass layers over the bonding layer, the one or more second glass layers comprising one or more second bus lines;
forming a plurality of sensor units on the one or more second bus lines, the plurality of sensor units alternating with the plurality of pixels; and
laminating the one or more first glass layers, the bonding layer, and the one or more second glass layers to define a laminated glass assembly;
wherein the first surface is free of sensor units and the second surface is free of pixels.

15. The method of claim 14, wherein the display unit is embedded within the bonding layer of the laminated glass assembly.

16. The method of claim 14, further comprising forming a color shifting layer between the bonding layer and one of the one or more first glass layers and the one or more second glass layers.

17. The method of claim 16, wherein the color shifting layer is positioned within a patterned protective layer.

18. The method of claim 16, wherein the display unit is embedded within the color shifting layer.

19. The method of claim 14, wherein the sensor unit comprises:

a micro IC comprising a driving circuit; and a micro sensor on a surface of the driving circuit.

* * * * *